US012180590B2

United States Patent
Wright et al.

(10) Patent No.: US 12,180,590 B2
(45) Date of Patent: Dec. 31, 2024

(54) COVER PLATE FOR COVERING THE SUSCEPTOR SIDE FACING THE PROCESS CHAMBER OF A DEVICE FOR DEPOSITING SIC LAYERS

(71) Applicant: AIXTRON SE, Herzogenrath (DE)

(72) Inventors: Benjamin David Wright, Cambridge (GB); Barry O'Neil, Herzogenrath (DE)

(73) Assignee: AIXTRON SE, Herzogenrath (DE)

( * ) Notice: Subject to any disclaimer, the term of this patent is extended or adjusted under 35 U.S.C. 154(b) by 874 days.

(21) Appl. No.: 17/250,194

(22) PCT Filed: Jun. 14, 2019

(86) PCT No.: PCT/EP2019/065688
§ 371 (c)(1),
(2) Date: Dec. 11, 2020

(87) PCT Pub. No.: WO2019/238930
PCT Pub. Date: Dec. 19, 2019

(65) Prior Publication Data
US 2021/0254214 A1    Aug. 19, 2021

(30) Foreign Application Priority Data
Jun. 14, 2018  (DE) .................... 10 2018 114 208.0

(51) Int. Cl.
*C23C 16/458*   (2006.01)
*H01L 21/687*   (2006.01)

(52) U.S. Cl.
CPC .... *C23C 16/4585* (2013.01); *H01L 21/68735* (2013.01); *H01L 21/68785* (2013.01)

(58) Field of Classification Search
USPC ............. 118/725, 724, 715, 728; 427/255.28
See application file for complete search history.

(56) References Cited

U.S. PATENT DOCUMENTS 5,782,979 A * 7/1998 Kaneno ................... C30B 25/12
                                                      118/728
5,911,461 A   6/1999 Sauter et al.
(Continued)

FOREIGN PATENT DOCUMENTS

| DE | 19940033 A1 | 5/2001 |
| DE | 102 32 731 A1 | 2/2004 |

(Continued)

OTHER PUBLICATIONS

English Translation JP2016012680A (Year: 2016).*
(Continued)

*Primary Examiner* — Yewebdar T Tadesse
(74) *Attorney, Agent, or Firm* — Ascenda Law Group, PC

(57) ABSTRACT

A device for depositing layers on flat substrates includes a susceptor which can be heated by a heating device. The substrates and cover plates enclosing same are arranged on an upper face of the susceptor facing a process chamber. The cover plates include inner cover plates, each of which forms an edge adjoining a substrate edge facing the center of the susceptor. The inner cover plates are arranged about the center of the susceptor in the circumferential direction, and adjacent ones of the inner cover plates adjoin each other at a separation joint. The separation joint is arranged at an angle α to a line which extends through the center of the susceptor and the center of one of the substrates in a radial direction.

14 Claims, 2 Drawing Sheets

(56) References Cited

U.S. PATENT DOCUMENTS

| | | |
|---|---|---|
| 2001/0047762 A1 | 12/2001 | Hayashi |
| 2004/0175939 A1 | 9/2004 | Nakamura et al. |
| 2006/0102081 A1 | 5/2006 | Ueno et al. |
| 2006/0269390 A1 | 11/2006 | Nakamura et al. |
| 2008/0014057 A1 | 1/2008 | Juergensen et al. |
| 2008/0206464 A1 | 8/2008 | Kappeler |
| 2009/0308319 A1 | 12/2009 | Cheng et al. |
| 2010/0216261 A1 | 8/2010 | Brenninger et al. |
| 2011/0143016 A1 | 6/2011 | Hong et al. |
| 2012/0070136 A1 | 3/2012 | Koelmel et al. |
| 2012/0156374 A1 | 6/2012 | Gurary et al. |
| 2013/0193132 A1 | 8/2013 | Serebryanov et al. |
| 2015/0075431 A1 | 3/2015 | Barriss et al. |
| 2015/0187620 A1 | 7/2015 | Gurary et al. |
| 2016/0172165 A1 | 6/2016 | Jeon et al. |
| 2016/0333479 A1 | 11/2016 | Boyd et al. |
| 2018/0251909 A1 | 9/2018 | Nakabayashi et al. |
| 2021/0238740 A1 | 8/2021 | Wright et al. |
| 2021/0254214 A1 | 8/2021 | Wright et al. |
| 2022/0186374 A1 | 6/2022 | Ruda Y Witt et al. |

FOREIGN PATENT DOCUMENTS

| | | |
|---|---|---|
| DE | 10 2005 018 162 A1 | 10/2006 |
| DE | 10 2005 018 161 A1 | 11/2006 |
| DE | 10 2009 010 555 A1 | 9/2010 |
| DE | 10 2011 053 498 A1 | 3/2013 |
| DE | 10 2012 106 796 A1 | 1/2014 |
| DE | 10 2013 111 165 A1 | 4/2015 |
| DE | 10 2014 114 947 A1 | 11/2015 |
| DE | 10 2014 117 388 A1 | 6/2016 |
| DE | 10 2016 103 530 A1 | 8/2017 |
| DE | 11 2016 003 443 T5 | 4/2018 |
| DE | 10 2017 101 648 A1 | 8/2018 |
| EP | 2498277 A1 | 9/2012 |
| JP | 2016-012680 A | 1/2016 |
| JP | 2016-035080 A | 3/2016 |

OTHER PUBLICATIONS

English Translation DE102013111165A1 (Year: 2013).*

Amendment filed Apr. 20, 2022, for U.S. Appl. No. 15/734,736, filed Dec. 3, 2020, 11 pgs.

Non-Final Office Action dated Dec. 22, 2023, for U.S. Appl. No. 17/250,221, filed Dec. 17, 2020, 19 pgs.

Restriction Requirement dated Aug. 25, 2023, for U.S. Appl. No. 17/250,221, filed Dec. 17, 2020, 9 pgs.

Final Office Action dated Jun. 8, 2022, for U.S. Appl. No. 15/734,736, filed Dec. 3, 2020, 8 pgs.

Non-Final Office Action dated Jan. 20, 2022, for U.S. Appl. No. 15/734,736, filed Dec. 3, 2020, 11 pgs.

Aixtron SE, "Device useful for thermal treatment of a semiconductor substrate, comprises susceptor, which forms the base of a process chamber and comprises substrate support base, substrate support ring and heat source", DE 102012106796A, Jan. 30, 2014, English translation, 13 pgs.

International Search Report mailed Sep. 30, 2019, from the ISA/European Patent Office, for International Patent Application No. PCT/EP2019/064392 (filed Jun. 4, 2019), 6 pages.

Written Opinion mailed Sep. 30, 2019, from the ISA/European Patent Office, for International Patent Application No. PCT/EP2019/064392 (filed Jun. 4, 2019), 10 pages.

International Search Report mailed Sep. 30, 2019, from the ISA/European Patent Office, for International Patent Application No. PCT/EP2019/065688 (filed Jun. 14, 2019), 8 pages.

Written Opinion mailed Sep. 30, 2019, from the ISA/European Patent Office, for International Patent Application No. PCT/EP2019/065688 (filed Jun. 14, 2019), 8 pages.

International Search Report mailed Nov. 20, 2019, from the ISA/European Patent Office, for International Patent Application No. PCT/EP2019/065721 (filed Jun. 14, 2019), 12 pages.

Written Opinion mailed Nov. 20, 2019, from the ISA/European Patent Office, for International Patent Application No. PCT/EP2019/065721 (filed Jun. 14, 2019), 16 pages.

Amendment filed Jul. 22, 2022, for U.S. Appl. No. 15/734,736, filed Dec. 3, 2020, 10 pgs.

Advisory Action dated Aug. 3, 2022, for U.S. Appl. No. 15/734,736 (Dec. 3, 2020), 3 pgs.

Appeal Brief filed Sep. 29, 2022, for U.S. Appl. No. 15/734,736 (Dec. 3, 2020), 27 pgs.

Examiner's Answer dated Nov. 14, 2022, for U.S. Appl. No. 15/734,736 (Dec. 3, 2020), 12 pgs.

Reply Brief filed Jan. 13, 2023, for U.S. Appl. No. 15/734,736 (Dec. 3, 2020), 19 pgs.

International Preliminary Report on Patentability issued Dec. 8, 2020, from The International Bureau of WIPO, for International Patent Application No. PCT/EP2019/064392 (filed Jun. 4, 2019), 19 pgs.

International Preliminary Report on Patentability issued Dec. 15, 2020, from The International Bureau of WIPO, for International Patent Application No. PCT/EP2019/065688 (filed Jun. 14, 2019), 18 pgs.

International Preliminary Report on Patentability issued Dec. 22, 2020, from The International Bureau of WIPO, for International Patent Application No. PCT/EP2019/065721 (filed Jun. 14, 2019), 33 pgs.

Written Opinion mailed Sep. 30, 2019, from the ISA/European Patent Office, for International Patent Application No. PCT/EP2019/064392 (filed Jun. 4, 2019), English translation, 7 pgs.

Written Opinion mailed Sep. 30, 2019, from the ISA/European Patent Office, for International Patent Application No. PCT/EP2019/065688 (filed Jun. 14, 2019), English translation, 8 pgs.

Written Opinion mailed Nov. 20, 2019, from the ISA/European Patent Office, for International Patent Application No. PCT/EP2019/065721 (filed Jun. 14, 2019), English translation, 15 pgs.

Final Office Action dated May 16, 2024, for U.S. Appl. No. 17/250,221, filed Dec. 17, 2020, 22 pgs.

Amendment filed Feb. 22, 2024, for U.S. Appl. No. 17/250,221, filed Dec. 17, 2020, 13 pgs.

* cited by examiner

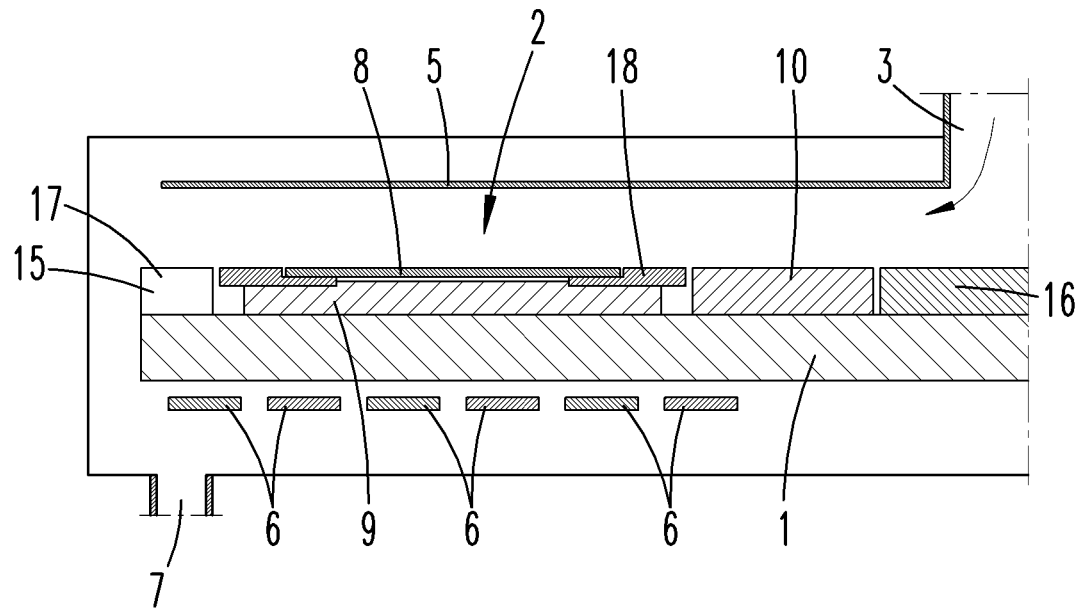
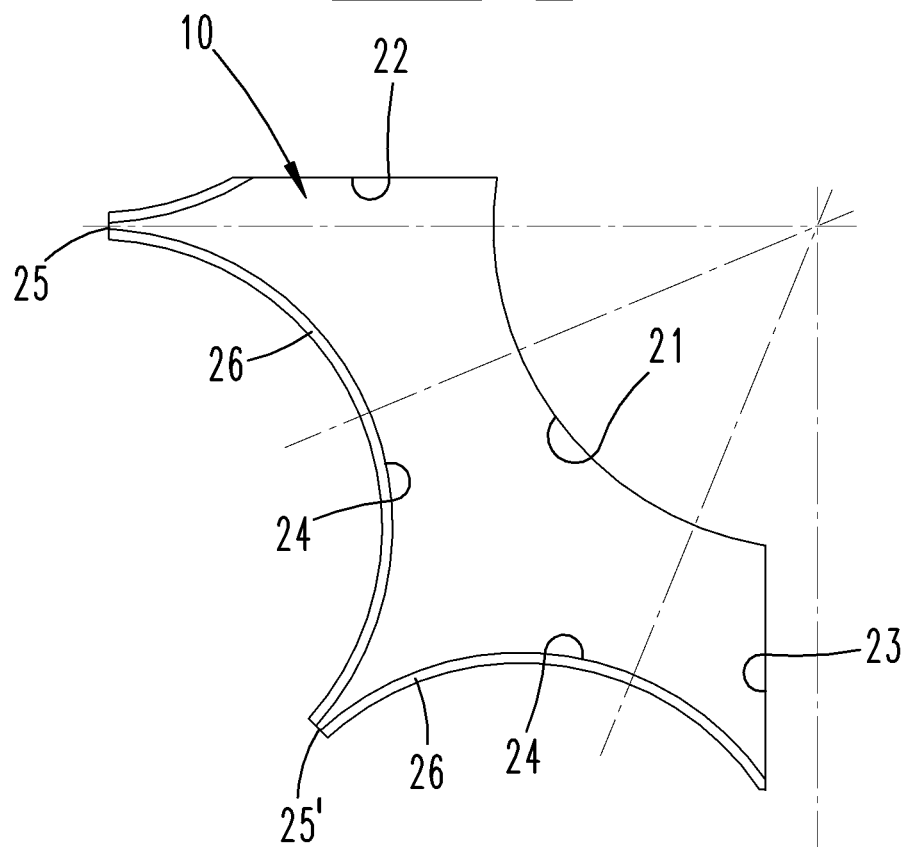

COVER PLATE FOR COVERING THE SUSCEPTOR SIDE FACING THE PROCESS CHAMBER OF A DEVICE FOR DEPOSITING SIC LAYERS

RELATED APPLICATIONS

This application is a National Stage under 35 USC 371 of and claims priority to International Application No. PCT/EP2019/065688, filed 14 Jun. 2019, which claims the priority benefit of DE Application No. 10 2018 114 208.0, filed 14 Jun. 2018.

FIELD OF THE INVENTION

The invention pertains to a device for depositing layers on flat substrates, comprising a susceptor that can be heated by a heating device, wherein the substrates and cover plates enclosing said substrates are arranged on the upper side of the susceptor that faces a process chamber, wherein inner cover plates respectively form an edge that borders on an edge of the substrate facing a center of the susceptor, and wherein two cover plates, which are arranged adjacent to one another about the center in the circumferential direction, border on one another at a separation joint.

The invention also pertains to a susceptor arrangement for such a device.

The invention furthermore pertains to a cover plate of the above-described type and a utilization of the device, the susceptor cover and the cover plate for depositing SiC layers, wherein gaseous starting materials containing silicon and carbon are fed into a process chamber of the CVD reactor through a gas inlet and the substrates are heated to temperatures above 1000 degrees Celsius, preferably above 1300 degrees Celsius, with a heating device.

Devices for depositing SiC layers comprise a reactor housing, a susceptor arranged in the reactor housing, a gas inlet and a gas outlet. The susceptor is heated, particularly from its underside, to temperatures above 1000 degrees Celsius, particularly above 1500 degrees Celsius, by means of a heating device. A gas mixture consisting of two process gases and a carrier gas is fed into a process chamber between the susceptor and a process chamber ceiling through a gas inlet. The carrier gas may be a noble gas, hydrogen or nitrogen. The process gases contain silicon and carbon. The process gas containing carbon may consist of a hydrocarbon. The process gas containing silicon may consist of a silicon-hydrogen compound.

In addition, a cleaning gas such as HCl may be fed into such a process chamber in order to clean the process chamber.

The substrates lie adjacent to one another on the surface of the susceptor that faces the process chamber, particularly on a circumferential line extending about a center of the susceptor that consists, e.g., of coated graphite. Cover plates, which may likewise be coated, are furthermore located on the surface of the susceptor. Inner cover plates are provided and adjoin the edges of the substrates facing the center with an edge that faces radially outward. Multiple cover plates of identical design are provided, wherein said cover plates lie adjacent to one another in the circumferential direction and border on one another at separation joints.

BACKGROUND

In a device known from the prior art, the separation joints extend in the radial direction. Imaginary extension lines extending through the separation joints extend through the center of the susceptor and through a center of a substrate.

Tensions occur in the cover plates when thicker layers are deposited. The tensions cause the edges of the cover plates to rise. These problems lead to unevenly deposited layers on the substrates if the flow direction of the starting materials extends radially and, in particular, when the susceptor rotates about the center.

SUMMARY OF THE INVENTION

The invention is based on the objective of disclosing measures for improving the lateral layer thickness homogeneity.

This objective is attained with the invention specified in the claims.

It is initially and essentially proposed that the separation joint is angularly offset relative to a radial line, which is drawn through the center in the radial direction, by a certain angle. It was surprisingly determined that such a change in the extending direction of the separation joint leads to a better layer thickness homogeneity than in the prior art. This is particularly the case if the process gases are fed into the process chamber through a gas inlet element arranged in the center of the process chamber and radially flow over the inner cover plates and the substrates enclosed thereby in the outward direction. The susceptor may be rotationally driven about the center in this case. It would furthermore be possible to rotationally drive the respective substrates, which are arranged on a circular arc line about the center. To this end, the substrates lie on substrate holders that have the shape of a circular disk and can be rotationally driven about their center. This is realized by means of a gas jet drive. Gas channels extend in the susceptor and lead to the upper side of the susceptor. The substrate holders lie in the outlet region of these channels and are rotationally driven due to a suitable alignment of the nozzles formed by the outlets while lying on a gas cushion. According to an enhancement of the invention, it is proposed that a line drawn through the separation joint extends through an edge of the inner cover plate bordering on the substrate. This edge of the cover plate preferably extends on a circular arc line. The line drawn through the separation joint neither extends through the center of the substrate nor through the center of the susceptor. According to an enhancement of the invention, it is proposed that the intersecting point between the line extending the separation joint and the radial line lies radially outside of the center of the susceptor. The intersecting point preferably lies between a substrate and the center point of the susceptor. A central and particularly circular cover plate may be arranged in the region of the center of the susceptor. The intersecting point lies in the region of this cover plate. The inventive inner cover plate has an inner edge that extends on a circular arc line and borders on a radially outer edge of the central cover plate. All cover plates preferably are designed identically. The inner cover plates may have multiple outer edges that extend on a circular arc line and respectively adjoin a substrate. Circumferential edges may extend between two outer edges of the cover plate. These circumferential edges extend about the center in the circumferential direction and border on an outer cover plate. The outer cover plate may have channels that are open radially outward and extend parallel to one another. The channels extend about tangentially to the substrates and can be used for respectively loading the susceptor with substrates or unloading substrates from the susceptor. A gripping arm may have parallel gripping fingers that can engage into the channels in order to engage underneath the edges of the substrates. The device is particularly suitable for depositing SiC, GaN, GaAs, AsP or other semiconductive material systems. This particularly concerns material systems that are used in the manufacture of power semiconductor components.

BRIEF DESCRIPTION OF THE DRAWINGS

An exemplary embodiment of the invention is described below with reference to the attached drawings. In these drawings:

FIG. 2 shows a section through an inventive device along the line II-II, and

FIG. 3 shows a top view of an inventive cover plate.

DETAILED DESCRIPTION

Figure 1:
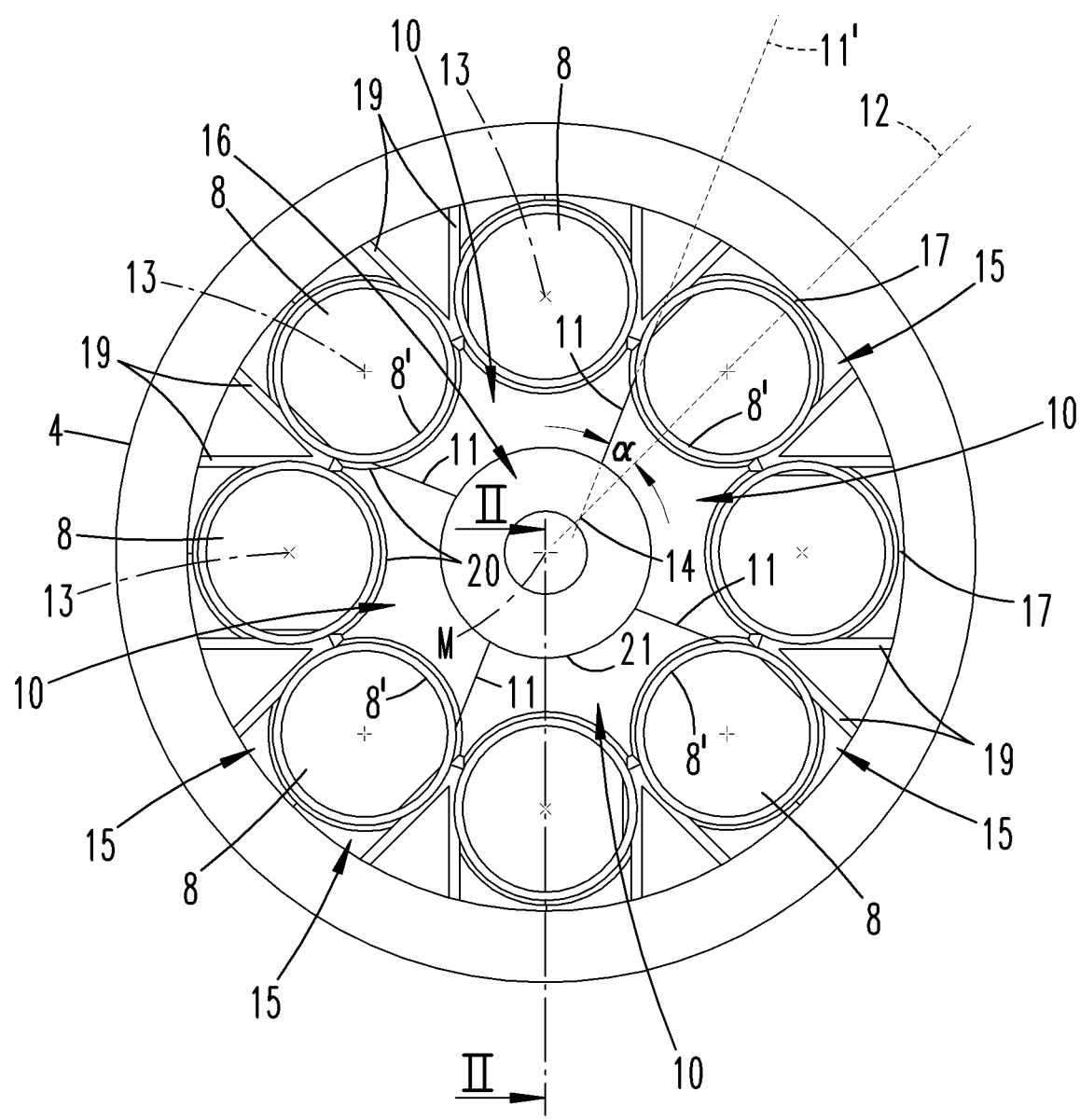
FIG. 1 shows a top view of an inventive susceptor arrangement.

FIG. 2 schematically shows a half section through a CVD reactor with a reactor housing 4. A susceptor 1, which consists of a graphite body with the shape of a circular disk, is located within the reactor housing 4. The surface of the susceptor 1 may be suitably coated.

A heating device 6 is located underneath the susceptor and makes it possible to heat the susceptor 1 to temperatures of typically 1600 degrees Celsius.

A circular inner, central cover plate 16 consisting of graphite lies on the upper side of the susceptor 1 that faces a process chamber 2. The center of the central cover plate 16 lies in the center M of the susceptor 1.

A circular edge of the central cover plate 16 borders on a total of four inner cover plates 10 that are arranged about the central cover plate 16 in the circumferential direction. More or fewer cover plates 16 may also be provided in not-shown exemplary embodiments.

Each of the identical inner cover plates 10 has an inner edge 21 that extends on a circular arc line and borders on the central cover plate 16. The cover plate 10 furthermore has two lateral edges 22, 23 that respectively extend linearly. Two outer edges 24, which respectively extend on circular arc lines, lie opposite of the inner edge 21. The outer edges 24 form a bezel 26. Circumferential edges 25, 25' respectively extend between two outer edges 24.

The lateral edges 22, 23 of cover plates 10, which are arranged adjacently about the center M in the circumferential direction, border on one another such that a separation joint 11 is formed. The edges 22, 23 of different cover plates 10 lie adjacent to one another in a contacting manner. A linearly extending separation joint 11 is formed.

FIG. 1 shows that an extension line 11' drawn through the linearly extending separation joint 11 includes an angle α with a radial line 12, wherein said radial line 12 is drawn through the center M of the susceptor 1 on the one hand and through a center 13 of a substrate 8 on the other hand. In the prior art, separation joints of cover plates that border on one another extend through such a radial line 12 whereas the inventive separation joint 11 is angularly offset relative to the radial line 12 by an angle α. However, the separation joint 11 or the line 11' extending the separation joint 11 respectively intersects the outer edge 24 extending on a circular arc line such that the extension line 11' still extends through an edge section of the substrate 8.

FIG. 1 also shows that the line 11' extending the separation joint 11 intersects the radial line 12 in an intersecting point 14 that lies radially outside of the center M. The radial distance of the intersecting point 14 from the center M may amount to approximately 20 to 35% of the distance, by which the edge 8' is spaced apart from the center M. However, the distance may also amount to between 10 and 40% of the radial distance of the center 13 of the substrate 8 from the center M.

The inner cover plate 10 may consist of graphite or coated graphite. It has a material thickness that lies in the range between 0.5 mm and 3 mm.

Outer cover plates 15 are located radially outside of the cover plates 10 and border on the circumferential edges 25, 25' of the cover plates 10 with edges facing radially inward.

The circumferential edges 25, 25' extend on a circumferential line that extends through the center points 13 of the substrates 8.

The outer cover plates 15 have channels 19 that are open radially outward and consist of depressions that are open toward the top. The channels 19 are tangent to the edges of the substrate 8. Fork prongs of a gripper can engage into the channels 19 in order to laterally engage underneath a support ring 18, which surrounds the substrate 8 and on which the substrate 8 lies, and to thereby load the device with substrates or unload substrates from the device.

In the inventive device, flat, circular substrates 8, the edges 8' of which adjoin the outer edges 24 of the cover plates 10, are coated with SiC. To this end, process gases are fed into the process chamber. This takes place through a gas inlet 3 in the center M of the process chamber 2 such that gas flows through the process chamber 2 radially from the inside toward the outside. The susceptor 1 may be rotationally driven in this case. The substrate carriers 9 may likewise be rotationally driven about their figure axis.

The process gases are fed into the process chamber 2 together with an inert gas such as argon, $H_2$, $N_2$ or the like. The process gases comprise a gas that contains silicon and a gas that contains carbon. The gas containing silicon may consist of $SiH_4$. The gas containing carbon may consist of a hydrocarbon such as $C_2H_8$.

SiC layers are deposited with a growth rate of 10 to 20 μm at typical process temperatures of 1600 degrees Celsius. The process gases decompose pyrolytically on the hot surfaces of the cover plates 10 and the substrate 8 during the deposition process. Layers are deposited on the cover plates 10, as well as on the substrate 8. With respect to the cover plate 10 consisting, e.g., of graphite, this leads to tensions that cause the edges 22, 23 of the cover plate to rise. Due to the inventive offset of the separation joint 11 relative to a radial line 12 by an angle α, the effects of the risen edges 22, 23 on the lateral flow through the process chamber 2 are influenced in such a way that the layer thickness of the layer deposited on the substrate 8 has a more uniform layer thickness distribution than in the prior art.

The angle α preferably lies in a range between 10 and degrees, particularly in a range between 20 and 30 degrees. In the exemplary embodiment, this angle amounts to 25 degrees.

FIG. 3 shows a cover plate 10 with two lateral edges 22, 23 that extend at a right angle to one another. The two edges 22, 23 run along lines extending parallel to a corresponding radial line that is illustrated in a dot-dashed manner in this figure. The edge 22 bordering on the separation joint 11 extends parallel to a line extending through the outer circumferential edge 25 and the center of the susceptor 1. The outer edge 25 is essentially located centrally between the centers of two adjacent substrates 13. A connecting line between the centers of two adjacent substrates 8 has a center point. The radial line extending parallel to the edge 22 extends through this center point.

The preceding explanations serve for elucidating all inventions that are included in this application and respectively enhance the prior art independently with at least the following combinations of characteristics, wherein two, multiple or all of these combinations of characteristics may also be combined with one another, namely:

A device, which is characterized in that the separation joint 11 extends angularly offset relative to a radial line 12, which is drawn through the center M of the susceptor 1 and the center 13 of the substrate 8 in the radial direction, by an angle α;

A susceptor arrangement for a device, which is characterized in that the separation joint 11 extends angularly offset relative to a radial line 12, which is drawn through the center M of the susceptor 1 and the center 13 of the substrate 8 in the radial direction, by an angle α;

A cover plate for a device, which is characterized in that the separation joint 11 extends angularly offset relative to a radial line 12, which is drawn through the center M of the susceptor 1 and the center 13 of the substrate 8 in the radial direction, by an angle α;

The utilization of a device, a susceptor arrangement or a cover plate in a CVD reactor for depositing SiC, wherein gaseous starting materials containing silicon and carbon are fed into a process chamber 2 of the CVD reactor through a gas inlet 7 and the substrates 8 are heated to temperatures above 1000 degrees Celsius, preferably above 1300 degrees Celsius, with a heating device 6;

A device, which is characterized in that a line 11' drawn through the separation joint 11 extends through the edge 20 of the cover plate 10 bordering on the substrate 8;

A device, which is characterized in that an intersecting point 14 between the line 11' extending the separation joint 11 and the radial line 12 lies radially outside of the center M;

A device, which is characterized in that a cover plate 10 encloses at least two substrates 8 on the radially inner side;

A device, which is characterized in that the angle between a line 11" extending the separation joint 11 and the radial line 12 lies in the range between 10 degrees and 40 degrees, preferably in a range between 20 degrees and 30 degrees;

A device, which is characterized in that outer cover plates 15 and/or a central cover plate 16 are/is provided radially outside of the inner cover plates 10 and/or in that an outer cover plate 15 forms channels 19 that are open toward the radially outer edge of the outer cover plate 10 and/or in that circumferential edges 25, which extend in the circumferential direction and border on outer cover plates 15, respectively extend between edges 24 extending along a circular arc line and/or in that an inner edge 21 extending along a circular arc line borders on a central cover plate 16.

All disclosed characteristics are essential to the invention (individually, but also in combination with one another). The disclosure of the associated/attached priority documents (copy of the priority application) is hereby fully incorporated into the disclosure content of this application, namely also for the purpose of integrating characteristics of these documents into claims of the present application. The characteristics of the dependent claims also characterize independent inventive enhancements of the prior art without the characteristics of a claim to which they refer, particularly for submitting divisional applications on the basis of these claims. The invention specified in each claim may additionally comprise one or more of the characteristics that were disclosed in the preceding description and, in particular, are identified by reference symbols and/or included in the list of reference symbols. The invention also concerns design variations, in which individual characteristics cited in the preceding description are not realized, particularly as far as they are obviously dispensable for the respective intended use or can be replaced with other, identically acting technical means.

LIST OF REFERENCE SYMBOLS

1 Susceptor
2 Process chamber
3 Gas inlet
4 Reactor housing
5 Process chamber ceiling
6 Heating device
7 Gas outlet
8 Substrate
8' Edge
9 Substrate carrier
10 (Inner) cover plate
11 Separation joint
11' Extending line
12 Radial line
13 Center point
14 Intersecting point
15 Outer cover plate
16 Central cover plate
17 Separation joint
18 Transport ring
19 Channel
20 Edge
21 Inner edge
22 Lateral edge
23 Lateral edge
24 Outer edge
25 Edge (circumferential edge)
26 Bezel
α Angle

The invention claimed is:

1. A susceptor arrangement for a device for depositing layers on a plurality of substrates (8), the susceptor arrangement comprising:
a susceptor (1); and
a plurality of cover plates (10, 15, 16), enclosing the plurality of substrates (8), that are arranged on a surface of the susceptor (1) that faces a process chamber,
wherein the plurality of cover plates (10, 15, 16) comprise a plurality of inner cover plates (10),
wherein each of the plurality of inner cover plates (10) forms an outer edge (24) that borders an edge (8') of one or more of the plurality of substrates (8) facing a center (M) of the susceptor (1),
wherein two of the plurality of inner cover plates (10), which are arranged adjacent to one another about the center (M) of the susceptor (1) in a circumferential direction, border one another at a linearly extending separation joint (11),
wherein the linearly extending separation joint (11) is angularly offset by an angle (α) relative to a first radial line (12) that extends through the center (M) of the susceptor (1) and a center (13) of one of the plurality of substrates (8) in a radial direction, and
wherein an intersecting point (14) between a linear line (11') drawn through the linearly extending separation joint (11) and the first radial line (12) lies radially outside of the center (M) of the susceptor (1).

2. The susceptor arrangement of claim 1,
wherein the outer edge (24) contacts the edge (8') of the one or more of the plurality of substrates (8), and
wherein the plurality of inner cover plates (10) are identical to one another.

3. The susceptor arrangement of claim 2, wherein the linear line (11') extending from the linearly extending separation joint (11) extends through the outer edge (24) that borders on the edge (8') of one or more of the plurality of substrates (8).

4. The susceptor arrangement of claim 1, wherein a distance between the intersecting point (14) and the center (M) of the susceptor (1) is greater than 10 mm.

5. The susceptor arrangement of claim 1, wherein one of the plurality of inner cover plates (10) encloses at least two of the plurality of substrates (8) on a radially inner side of the at least two substrates (8).

6. The susceptor arrangement of claim 1, wherein the angle (a) lies in a range between 10 degrees and 40 degrees.

7. The susceptor arrangement of claim 1, wherein the plurality of cover plates (10, 15, 16) further comprises a plurality of outer cover plates (15) that are arranged on a first region of the susceptor (1) that is radially outside of a second region of the susceptor (1) on which the plurality of inner cover plates (10) are arranged.

8. The susceptor arrangement of claim 7, wherein the plurality of outer cover plates (15) form channels (19) that are open toward a radially outer edge of the plurality of outer cover plates (15).

9. The susceptor arrangement of claim 7, wherein circumferential edges (25) of the plurality of inner cover plates (10), which extend in a circumferential direction and border the outer cover plates (15), respectively extend between the outer edges (24) of the plurality of inner cover plates (10), each of the outer edges (24) extending along a circular arc line.

10. The susceptor arrangement of claim 1, wherein the plurality of cover plates (10, 15, 16) further comprises a central cover plate (16) covering the center (M) of the susceptor (1).

11. The susceptor arrangement of claim 1, wherein an inner edge (21) of each of the plurality of inner cover plates (10) extends along a circular arc line that borders a central cover plate (16).

12. The susceptor arrangement of claim 1, wherein a lateral edge (22) bordering the linearly extending separation joint (11) extends parallel to a second radial line extending through the center (M) of the susceptor (10) and a center point of a connecting line between respective centers (13) of two of the plurality of substrates (8) that are adjacent to one another.

13. The susceptor arrangement of claim 1, wherein a distance between the intersecting point (14) and the center (M) of the susceptor (1) measures between 10% and 40% of a radial distance between the center (13) of one of the plurality of substrates (8) and the center (M) of the susceptor (1).

14. A method of using the susceptor arrangement of claim 1 in a chemical vapor deposition (CVD) reactor for depositing SiC, GaN, GaAs, AsP or other semiconductor layers, wherein gaseous starting materials are fed into a process chamber (2) of the CVD reactor through a gas inlet (7) and the plurality of substrates (8) are heated to temperatures above 600 degrees Celsius with a heating device (6).

* * * * *